(12) United States Patent
Dosaka et al.

(10) Patent No.: US 6,400,628 B2
(45) Date of Patent: Jun. 4, 2002

(54) SEMICONDUCTOR MEMORY DEVICE

(75) Inventors: Katsumi Dosaka; Hiroki Shimano; Hiroki Sugano; Kazutami Arimoto, all of Hyogo (JP)

(73) Assignees: Mitsubishi Denki Kabushiki Kaisha; Mitsubishi Electric Engineering Company Limited, both of Tokyo (JP)

( * ) Notice: Subject to any disclaimer, the term of this patent is extended or adjusted under 35 U.S.C. 154(b) by 0 days.

(21) Appl. No.: 09/748,139

(22) Filed: Dec. 27, 2000

(30) Foreign Application Priority Data

Dec. 27, 1999 (JP) .......................................... 11-370179

(51) Int. Cl.[7] .................................................. G11C 7/02
(52) U.S. Cl. ........................................ 365/210; 365/63
(58) Field of Search ........................... 365/51, 149, 210, 365/63; 257/300

(56) References Cited

U.S. PATENT DOCUMENTS 4,689,770 A    8/1987   Miyamoto et al.
5,714,779 A  * 2/1998   Auer et al. ................. 257/298

FOREIGN PATENT DOCUMENTS

JP    9-198900    7/1997
JP   10-303389   11/1998

* cited by examiner

*Primary Examiner*—A. Zarabian
(74) *Attorney, Agent, or Firm*—McDermott, Will & Emery

(57) ABSTRACT

A dummy bit line is formed from the same layer as and separately from a bit line, and is running in parallel with the bit line. Capacitor is formed on the layer upper than bit line and has a cell plate. An intermediate interconnection is formed on the layer upper than capacitor and is electrically connected to cell plate and dummy bit line. Thus, a semiconductor memory device is obtained in which a cell plate voltage can reliably be fed to a cell plate while preventing the increase of the area of a chip.

11 Claims, 9 Drawing Sheets

SEMICONDUCTOR MEMORY DEVICE

BACKGROUND OF THE INVENTION

1. Field of the Invention

The present invention relates to a semiconductor memory device.

2. Description of the Background Art

A memory cell array of a DRAM (Dynamic Random Access Memory) has a configuration in which memory cells, each including a transistor and a capacitor, are arranged in array-like manner, i.e. in row and column directions. In its operation, a word line selected by a row address rises to turn on the transistor connected to the word line. Each potential stored in the capacitor of a memory cell arranged in a certain row is thereby read out simultaneously by a sense amplifier via a bit line, and is amplified to the level "H" (array voltage, VDD) or "L" (VSS). The above-described bit line is pre-charged to a bit line pre-charge voltage, i.e. a constant voltage (VBL, generally VDD/2), until the above-described word line rises. A cell plate electrode is arranged as a common opposing electrode for a capacitor of each memory cell, and is fixed to a constant cell plate voltage (VCP, generally VDD/2).

In case of a DRAM having a large capacity, in order to accommodate with the increase of power consumption and access time, the memory cell array is divided into a large number of sub memory arrays and the word line is formed to have a hierarchical word configuration including a main word line and a sub word line.

FIG. 6 schematically shows a configuration of a multi-divided memory array and FIG. 7 is a detailed view of a sub memory array SMA, a sub word driver band SWD and a sense amplifier band SA.

Mainly referring to FIG. 6, in the multi-divided memory array, the memory cell array is divided into a large number of sub memory arrays SMA, and the sub word driver band SWD and the sense amplifier band SA are arranged for each of the plurality of sub memory arrays SMA. A main word line MWL extends in row direction crossing over the plurality of sub memory arrays SMA arranged in row direction, and a sub word line SWL connected to the main word line MWL via the sub word driver SWD also extends in row direction across each of the sub memory arrays SMA. The main word line MWL is driven by a main word driver MWD in response to the signals of a row decoder RD.

Mainly referring to FIG. 7, the sub memory array SMA has a plurality of memory cells MC arranged in a matrix. Each gate of the memory cells MC arranged in the same row is connected to the sub word line SWL, which is in turn connected to each of the drivers SWDa of the sub word driver band SWD. The memory cells MC arranged in the same column are respectively connected to one of a pair of bit lines BL and /BL. The bit-line pair BL and /BL is connected to any of the sense amplifiers S/A, illustrated at the top or the bottom in FIG. 7, via NMOS transistors NT 10 and NT 11 in which a shared gate signal SHRb is input to the respective gates.

In addition to a plurality of sense amplifiers S/A and a plurality of S/A shared circuits including NMOS transistors NT 10 to NT 13, the sense amplifier band SA has a plurality of equalizing circuits including NMOS transistors NT15 to NT17. These equalizing circuits are used to apply the pre-charge voltage VBL described above to the bit lines BL and /BL.

The sub word line SWL is driven by the sub word driver SWDa in response to the signals of the main word line MWL and a sub decoding line SDL.

The above-described memory cell MC has a one transistor-one capacitor configuration including a transistor 110 and a capacitor 120, as shown in FIG. 8, for example. As shown in FIG. 7, a cell plate 113 of capacitor 120 extends substantially over entire region of the sub memory array SMA. Cell plate 113 is connected, at several portions, to a VCP power-supply interconnection 117a extending in the vicinity of the border between the sub memory array SMA and the sub word driver band SWD, so that cell plate 113 is fixed to the cell plate voltage VCP.

An example of a conventional configuration for applying the cell plate voltage VCP to the cell plate is shown in FIG. 9.

Referring to FIG. 9, MOS transistors 110 and 130 are formed on the surface of a semiconductor substrate 101 electrically isolated by a trench isolation 102. MOS transistors 110 and 130 have pairs of source/drain regions 103 and 121 respectively, and the transistors have respective gate electrodes 105 and 123 formed on the regions sandwiched between the source/drain regions 103 and 121, with gate insulating layers 104 and 122 interposed, respectively. In particular, gate electrode 105 forms the sub word line SWL described above.

A bit line 107 and dummy bit lines 107a, 107b are formed on an interlayer insulating layer 106 covering MOS transistors 110 and 130. Bit line 107 is electrically connected to source/drain region 103 through a contact hole 106a.

A COB (Capacitor Over Bitline) structure is employed in that a capacitor 120 is formed on an interlayer insulating film 108 covering bit line 107. Capacitor 120 is a stacked capacitor having a storage node 111 and a cell plate 113 opposing to storage node 111 with a capacitor dielectric layer 112 posed therebetween. Storage node 111 has a tubular portion extending upward and is electrically connected to source/drain region 103 through a contact hole 108a.

A dummy storage node 111a is formed in a dummy region. A main word line 115 and an intermediate interconnection 115a are formed as the first metal interconnections on an interlayer insulating film 114 covering capacitor 120. Intermediate interconnection 115a is electrically connected to cell plate 113 through a contact hole 114a.

A VCP power-supply interconnection 117a and an interconnection 117b are formed as the second metal interconnections on an interlayer insulating film 116 covering main word line 115 and intermediate interconnection 115a. VCP power-supply interconnection 117a is electrically connected to intermediate interconnection 115a via a through hole 116a. A power-supply interconnection, a GND interconnection and a global I/O interconnection are also formed as the second metal interconnections.

Thus, the feeding of the cell plate voltage VCP to the cell plate 113 has conventionally been provided from VCP power-source line 117a through intermediate interconnection 115a.

As can be seen from FIG. 7, cell plate 113 having a large area approximately the same as the sub memory array is fed at several portions with the VCP power supply, whereby the potential is surely fixed. Insufficient fixation of the potential causes the variation of the potential of cell plate 113 upon continued writing of the same data in page mode operation, and the insufficient storage potential of the memory cell MC. "L" to "H" error tends to occur as the potential of cell plate 113 is raised, whereas "H" to "L" error tends to occur as the potential is lowered.

Although it has been described that VCP power-source line 117a is arranged on the border between the sub memory array region and the sub word driver band, it may also be arranged on the sub memory array region. In any case, by arranging VCP power-source line 117a in a region other than the sub word driver band, the increase in the width of the sub word driver band is prevented.

However, in the system LSI (Large Scale Integrated) circuit embedding DRAM, the method of feeding VCP to the above-described cell plate may not be used in some cases, as will be described in the following.

When the memory array is configured with the memory cells of the stacked-capacitor type, a large step is generated between the memory array portion and the other peripheral portion. Further, as shown in FIG. 9, the step in the interlayer insulating film 116 of an upper layer is larger than that in interlayer insulating film 114 of a lower layer. The height of the step of interlayer insulating film 116 could be 100 nm or more depending on the height of the stacked capacitor.

On the other hand, when forming a plurality of through holes or contact holes on a same process step, the through holes or the contact holes are required to have a uniform size (opening diameters) across the entire chip. This is because the etching characteristics upon forming the holes and the embedding characteristics upon embedding plugs into the through holes or the like are considered. It is thus impossible to partially enlarge the size of the through holes or the contact holes of a certain block.

Generally, in the system LSI, the size of the through holes or the contact holes is set small in order to increase the gate density of a logic block. It is thus necessary to accommodate the size of the through holes or the contact holes of the embedded DRAM portion to the smaller size of the logic block, since the size uniformity is required across the entire chip as described above. Thus, the size of the through holes or the contact holes on the memory array portion of the embedded DRAM will be smaller than those of a commodity DRAM where the memory cell array is configured with the memory cells of the same design dimension.

The size reduction then leads to the reduction of DOF (Depth of Focus) on a lithographic process, causing difficulties in the formation of the through holes or the contact holes in the memory array region and the stepped region described above. In particular, on the above-described interlayer insulating film 116 in which the step is larger, the through holes or the like cannot be placed, and should be placed in the region considerably inner side of the sub word driver band and/or the sense amplifier band.

For the reasons described above, VCP power-source line 117a needs to be arranged considerably inner side of the sub word driver band (right side in the drawing), and intermediate interconnection 115a needs to be extended from the region directly above cell plate 113 to the region directly below VCP power-source line 117a.

Further, a local power-supply interconnection of VCP may possibly be arranged as the first metal interconnection. However, the main word line MWL is extending, from the memory array, orthogonally crossing the local power-supply interconnection of VCP at the first metal interconnection. The main word line MWL thus needs to be partly raised to the second metal interconnection so as to cross over the local power-supply interconnection of VCP. In this case also, the positions of the through holes are thereby restricted and the local power-supply interconnection needs to be arranged considerably inner side of the sub word driver band.

When the power-supply interconnection of VCP (VCP power-supply interconnection 117a or the local power-supply interconnection of VCP) is arranged in the sub word driver band SWD as described above, the width of the sub word driver band SWD is increased, because of the interconnection region of the power-supply interconnection of VCP, the connecting portion between the VCP power-supply interconnection and through hole 116a of intermediate interconnection 115a, and intermediate interconnection 115a running a significant distance transverse to the sub word driver band SWD. Thus, as the number of the division of sub memory array SMA in row direction is increased, the sum of the increased part of the width of the above-described sub word driver band SWD is increased, causing the problem in that the area of the chip is increased.

On the other hand, there is a method of feeding VCP in that the power-supply interconnection is arranged in parallel with the main word line MWL on the border between sub memory array SMA and sense-amplifier band SA, while connecting the power-supply interconnection to the cell plate at several portions. In this case, however, the width of sense amplifier band SA is increased by the interconnection region of the power-supply interconnection of VCP, causing the problem in that the area of the chip is increased as the number of the division of sub memory array SMA in column direction is increased.

SUMMARY OF THE INVENTION

An object of the present invention is to provide a semiconductor memory device, which ensures the feeding of a cell plate voltage to a cell plate, while preventing the increase of the chip area.

The semiconductor memory device of the invention includes a semiconductor substrate, a bit line, a dummy bit line, a capacitor and a first intermediate interconnection. The semiconductor substrate has a main surface. The bit line is formed on the main surface. The dummy bit line is formed from the same layer as and separately from the bit line. The capacitor has an upper electrode formed above the bit line. The first intermediate interconnection is formed above the capacitor and is electrically connected to the dummy bit line and an upper electrode.

In the semiconductor memory device of the present invention, the dummy bit line and the first intermediate interconnection are connected via a contact hole under the first intermediate interconnection. The influence of a step generated upon formation of the contact hole is thereby reduced compared to the conventional method in that a through hole is formed on the first intermediate interconnection. Thus, the contact hole for connecting the dummy bit line and the first intermediate interconnection can also be formed, for example, on the border between the sub memory array region and the sub word driver band. This eliminates the conventional need for forming the first intermediate interconnection and the contact hole connected thereto considerably inner side of the sub word driver band. Therefore, the increase of the width of the sub word driver and the area of the chip can be prevented.

Preferably, the semiconductor memory device described above further includes a pair of source/drain regions formed at the main surface, a sub word line extending on the region sandwiched between the pair of source/drain regions with the gate insulating layer interposed, and a main word line formed from the same layer as and separately from the first intermediate interconnection and forming a hierarchical word line configuration together with the sub word line.

The first intermediate interconnection can thus be formed from the same layer as and separately from the main word line and can efficiently be formed in the hierarchical word configuration.

In the semiconductor memory device described above, preferably, a plurality of memory cells are arranged, each including a transistor having a pair of source/drain regions and a gate electrode formed by the sub word line and a capacitor to configure a sub memory array. A memory cell array is configured by a plurality of sub memory arrays.

Thus, in a DRAM with a large capacity having a multi-divided memory array configuration, a predetermined potential can reliably be fed to the upper electrode of the capacitor, while preventing the increase of the area of the chip.

Preferably, the semiconductor memory device described above further includes an upper-layer interconnection formed above the first intermediate interconnection and electrically connected to the dummy bit line.

The predetermined potential to be applied to the upper electrode can thus be fed to the upper electrode from the upper-layer interconnection through a dummy bit line.

Preferably, the semiconductor memory device described above further includes a second intermediate interconnection formed from the same layer as and separately from the first intermediate interconnection. The upper-layer interconnection is electrically connected to the second intermediate interconnection with the dummy bit line interposed.

The second intermediate interconnection is thus provided between the dummy bit line and the upper-layer interconnection as described above, thereby facilitating the formation of the through hole for connecting the dummy bit line and the upper-layer interconnection.

In the semiconductor memory device described above, preferably, the voltage having a same level as the pre-charge voltage for the bit line is applied to the upper electrode via the dummy bit line and the first intermediate interconnection.

Thus, the same voltage as the pre-charge voltage can reliably be fed to the upper electrode.

Preferably, in the semiconductor memory device described above, the material of the first intermediate interconnection is made of metal, and the material of the bit line includes at least one of silicon and refractory metal.

The materials suitable for the first intermediate interconnection and the bit line are thus selected. The semiconductor memory device described above further includes an additional dummy bit line running in parallel with the dummy bit line. The dummy bit line and the additional dummy bit line are connected at several portions.

Therefore, even if the dummy bit line directly connected to the first intermediate interconnection is cut off, the first intermediate interconnection can still be fed by detouring the additional dummy bit line.

Preferably, in the semiconductor memory device described above, the first intermediate interconnection is disposed extending in parallel to the main word line.

Preferably, in the semiconductor memory device described above, the dummy bit line has a branch for connecting with the first intermediate interconnection.

Preferably, in the semiconductor memory device described above, the bit line is located at one side of the dummy bit line, and the branch extends to another side of the dummy bit line.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is described in the following, based on the drawings.

Figure 1:
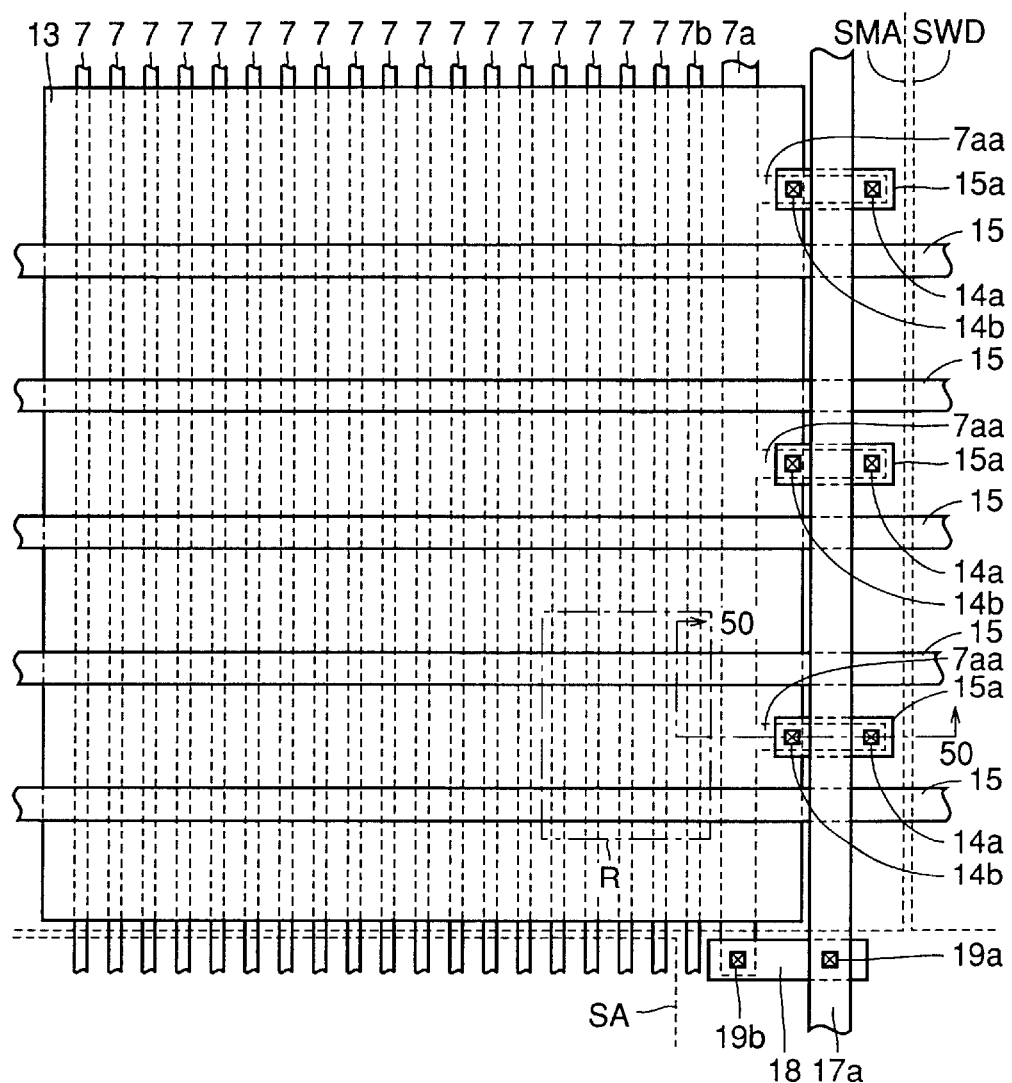
FIG. 1 is a plan view illustrating the configuration of VCP feeding to a cell plate in a semiconductor memory device according to the first embodiment of the present invention.

Mainly referring to FIG. 1, in a sub memory array region SMA, a plurality of bit lines 7 and a plurality of main word lines 15 are arranged orthogonal to each other. Main word line 15 is formed of the first metal interconnection. In the vicinity of the end portion of sub memory array region SMA, dummy bit lines 7a and 7b are arranged in parallel with bit line 7. A cell plate 13 is formed on the layer upper than bit line 7 and lower than main word line 15. This cell plate 13 extends substantially over entire area of sub memory array region SMA.

Dummy bit line 7a is electrically connected to an intermediate interconnection 18 via a contact hole 19b. The intermediate interconnection 18 is the first metal interconnection formed from the same layer as and separately from main word line 15. Intermediate interconnection 18 is electrically connected to an upper-layer global power-supply interconnection 17a of VCP formed of the second metal interconnection via a through hole 19a. The global power-supply interconnection 17a extends in the vicinity of and along the border between sub memory array region SMA and a sub word driver region SWD.

Dummy bit line 7a has a branch portion 7aa extending toward peripheral side (right side in FIG. 1) outer from cell plate 13. Branch portion 7aa is electrically connected to intermediate interconnection 15a via a contact hole 14a. Intermediate interconnection 15a is the first metal interconnection formed from the same layer as and separately from main word line 15a. Intermediate interconnection 15a is electrically connected to cell plate 13 via a contact hole 14b. Dummy bit line 7a is thus electrically connected to cell plate 13 at several portions.

Therefore, VCP applied to a VCP global power-supply interconnection 17a is fed to cell plate 13 via dummy bit line 7a and intermediate interconnection 15a.

Figure 2:
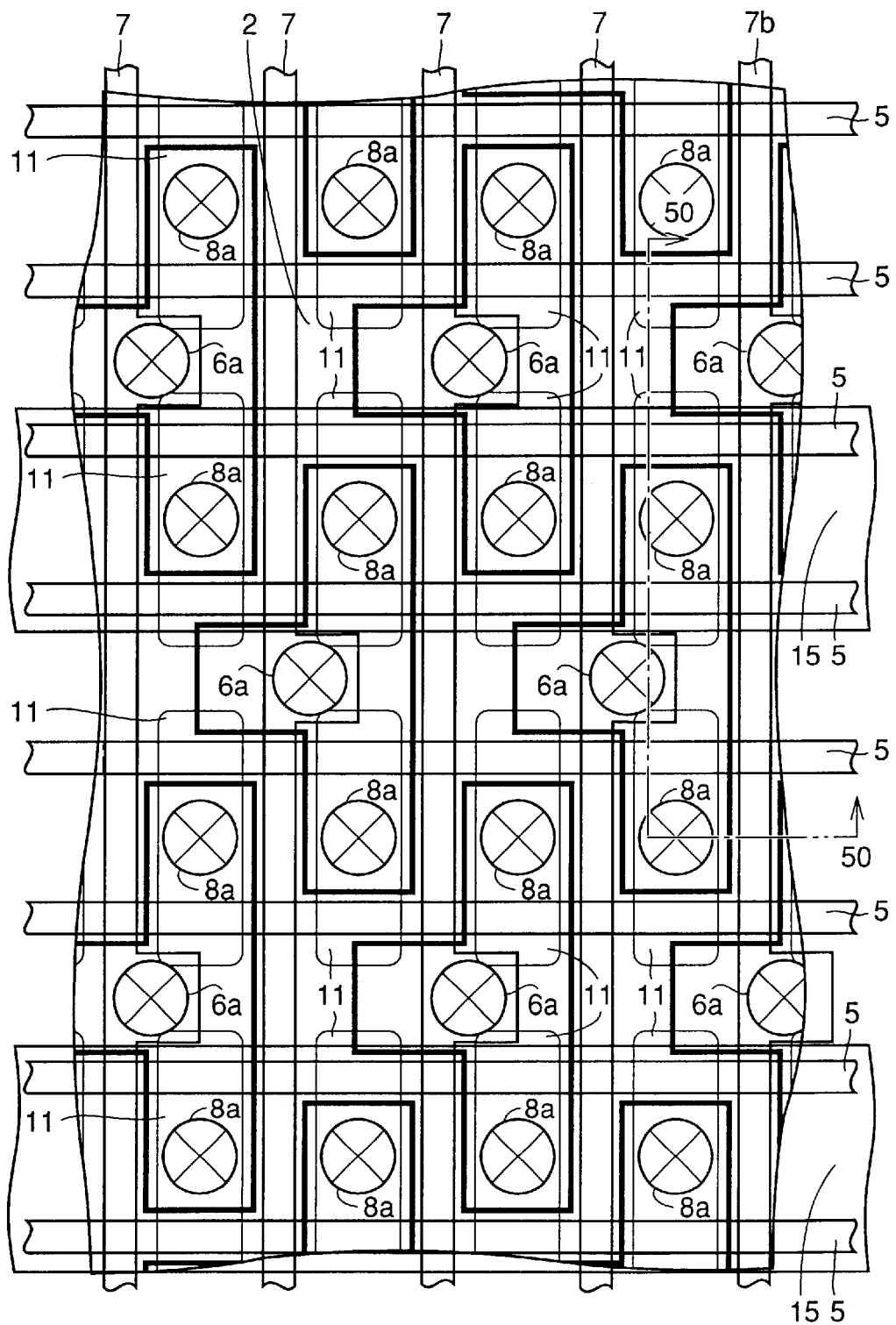
FIG. 2 is an enlarged view of the region R shown in FIG. 1.

As shown in FIG. 2, a plurality of sub word lines 5 are arranged in the same direction as main word line 15, and a memory cell having one transistor-one capacitor configuration is arranged near the crossing portion of sub word line 5 and bit line 7.

Figure 3:
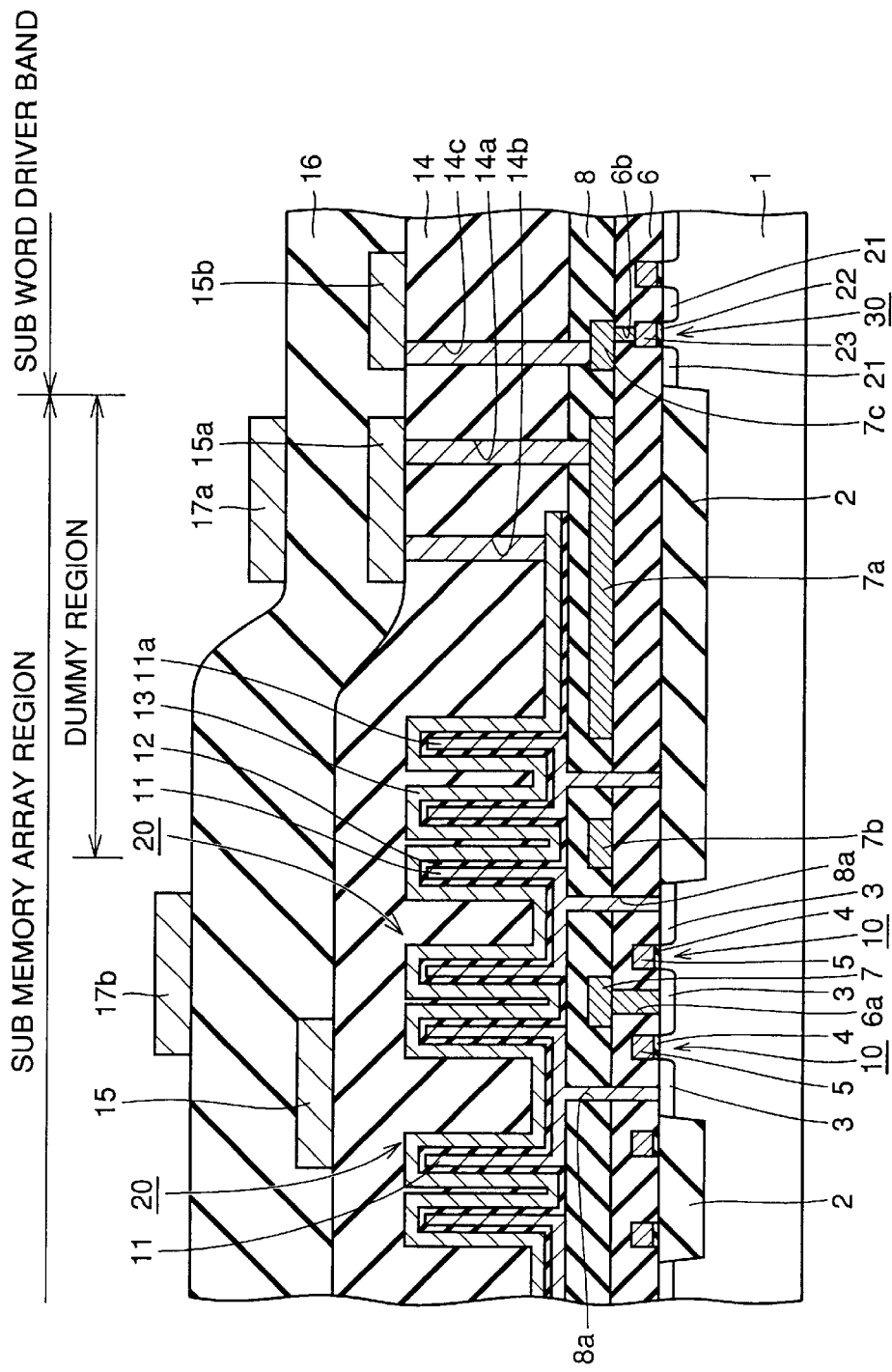
FIG. 3 is a schematic sectional view taken along the line 50—50 of FIGS. 1 and 2.
Figure 4:
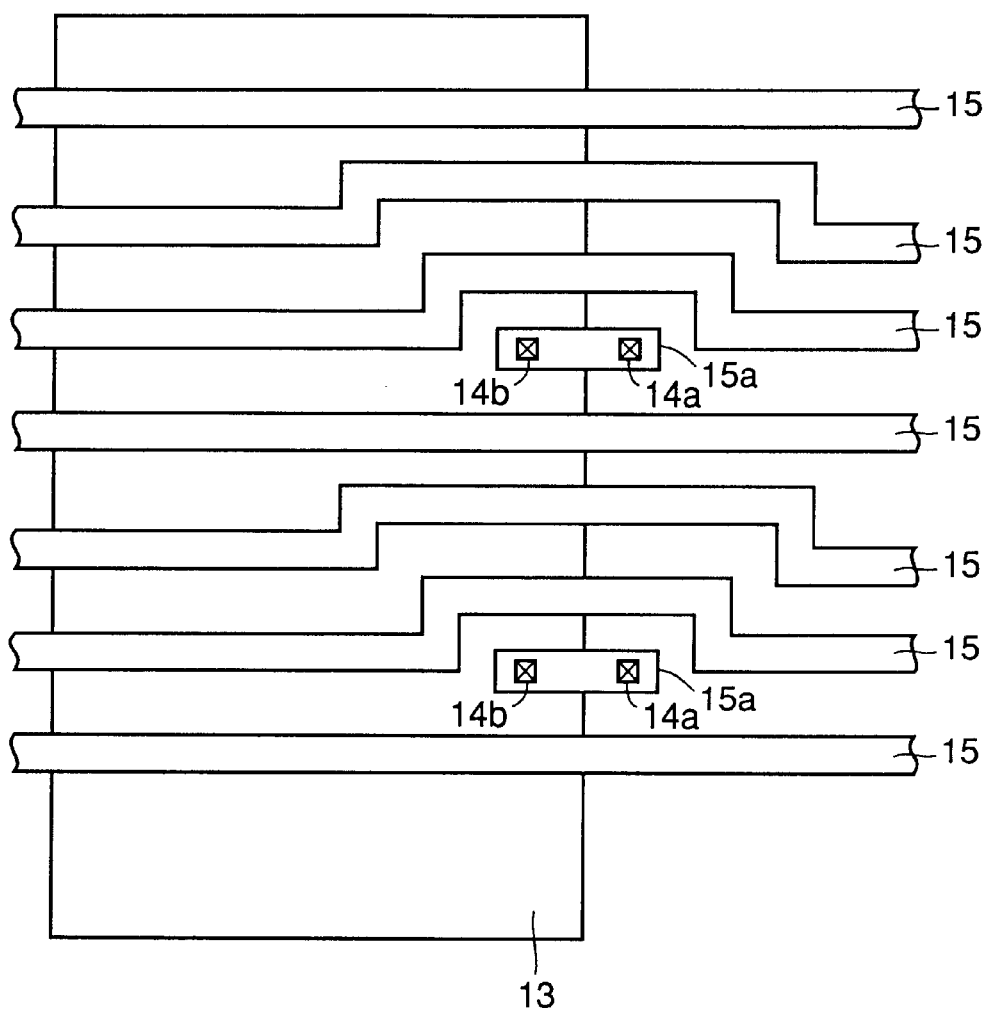
FIG. 4 is a plan view illustrating the configuration in that a main word line is detouring an intermediate interconnection in the semiconductor memory device according to the first embodiment of the invention.

Next, the above-described configuration is described with reference to a sectional view. Referring to FIG. 3, MOS transistors 10 and 30 are formed on the surface of a semiconductor substrate 1 electrically isolated by trench isolation 2. MOS transistor 10 is formed to provide a memory cell within the sub memory array region SMA, and MOS transistor 30 is formed to provide a sub word driver in the sub word driver band SWD.

MOS transistor 10 includes a pair of source/drain regions 3 formed on the surface of semiconductor substrate 1 and a gate electrode layer 5 formed on the region sandwiched between the pair of source/drain regions 3 with an insulating layer 4 interposed. MOS transistor 30 further includes a pair of source/drain regions 21 formed on the surface of semiconductor substrate 1 and a gate electrode layer 23 formed on the region sandwiched between the pair of source/drain regions 21 with a gate insulating layer 22 interposed. Gate electrode layers 5 and 23 are formed of a material including silicon, for example, polycrystalline silicon (doped polycrystalline silicon) into which an impurity are introduced, or polycide such as $WSi_x$. Further, gate electrode layer 5 forms a sub word line SWL.

An interlayer insulating film 6 is formed on the entire surface covering the MOS transistors 10 and 30. Bit line 7, dummy bit lines 7a, 7b and a interconnection 7c are separately formed, from one same layer, on interlayer insulating film 6. Bit line 7, dummy bit lines 7a, 7b and interconnection 7c are formed of the material including silicon, for example, doped polycrystalline silicon or polycide such as $WSi_x$, or of a refractory metal such as W (tungsten). Bit line 7 is electrically connected to source/drain regions 3 via a contact hole 6a. Interconnection 7c is also electrically connected to gate electrode layer 23 via contact hole 6b.

An interlayer insulating film 8 is formed on the entire surface covering bit line 7, dummy bit line 7a, 7b and interconnection 7c. A plurality of capacitors 20 are formed on sub memory array region SMA of interlayer insulating film 8.

A capacitor 20 is a stacked capacitor having a storage node 11 (lower electrode) and a cell plate (upper electrode) 13 opposing to storage node 11 with a capacitor dielectric layer 12 interposed. Storage node 11 has a tubular portion extending upwardly, and is electrically connected to source/drain regions 3 via a contact hole 8a. Cell plate 13 is shared by capacitors 20 and formed to extend toward the direction of the sub word driver band SWD (right side in the figure).

A storage node 11a is formed on the peripheral side of a plurality of storage nodes 11.

An interlayer insulating film 14 is formed on the entire surface covering capacitor 20. Main word line 15, intermediate interconnection 15a and interconnection 15b are formed, from one same layer, separately from each other. Main word line 15, intermediate interconnection 15a and interconnection 15b are the first metal interconnections formed of a metal such as aluminum (Al) or an alloy including the same.

Intermediate interconnection 15a is electrically connected to dummy bit line 7a via contact hole 14a and is also electrically connected to cell plate 13 via contact hole 14b.

Interconnection 15b is electrically connected to interconnection 7c via a contact hole 14c. Main word line 15 extends into the sub memory array region.

An interlayer insulating film 16 is formed on the entire surface covering main word line 15, intermediate interconnection 15a and interconnection 15b. VCP global power-supply interconnection 17a and interconnection 17b are formed from one same layer separately from each other on interlayer insulating film 16. VCP global power-supply interconnection 17a and interconnection 17b are the second metal interconnection formed of metal such as Al or an alloy including thereof. VCP global power-supply interconnection 17a is electrically connected to dummy bit line 7a, with intermediate interconnection 18 interposed, in the region outside of sub memory array region SMA, as shown in FIG. 1.

In the present embodiment, VCP can reliably be fed to cell plate 13 from VCP global power-supply interconnection 17a via intermediate interconnection 18, dummy bit line 7a and intermediate interconnection 15a.

Figure 9:
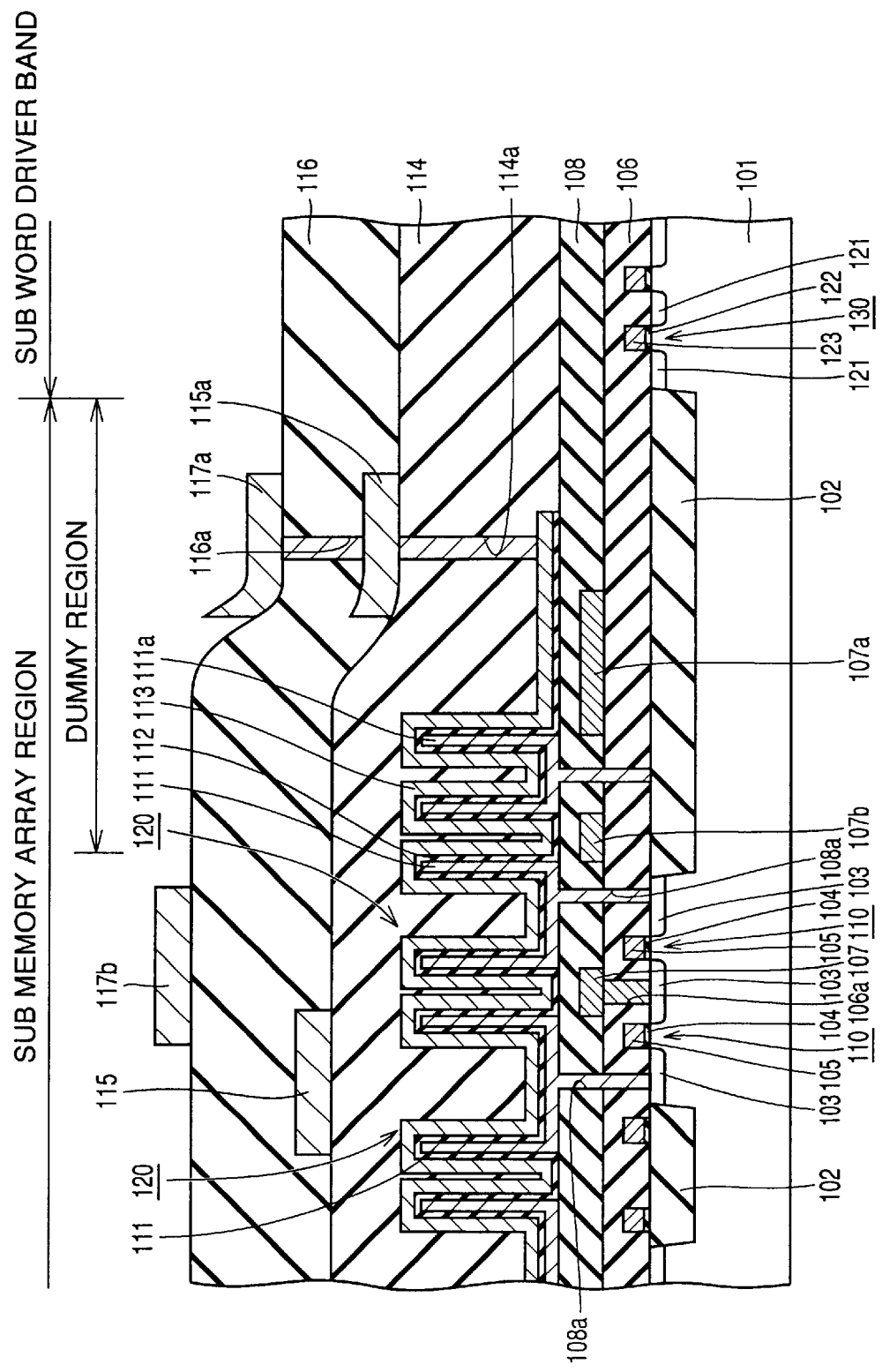
FIG. 9 is a schematic sectional view illustrating the configuration of VCP feeding to the cell plate in the conventional semiconductor memory device.

Further, as shown in FIG. 3, dummy bit line 7a and intermediate interconnection 15a are connected via contact hole 14a provided under intermediate interconnection 15a. Thus, the influence of the step generated upon formation of contact hole 14a is reduced compared to the conventional example shown in FIG. 9 in that a through hole 116a is formed on intermediate interconnection 115a. Contact hole 14a can thereby be satisfactory formed in the vicinity of the border between the sub memory array region and the sub word driver band SWD. This eliminates the need for forming contact hole 14a and intermediate interconnection 15a considerably inner side of sub word driver band SWD, thereby preventing the increase in the width of sub word driver band SWD and in the chip area.

Further, it is unnecessary to extend intermediate interconnection 15a from cell plate 13 to considerably inner side of the sub word driver band SWD, thus saving the length of intermediate interconnection 15a.

The feeding of the cell plate voltage VCP to dummy bit line 7a from VCP global power-supply interconnection 17a will be sufficient if it can be electrically connected to dummy bit line 7a at one portion outside of sub memory array region SMA. Thus, global power-supply interconnection 17a can be arranged on sub memory array region SMA, or on the border between sub word driver band SWD and the sub memory array region SMA. The sub word driver band SWD is thus not increased by such arrangement of global power-supply interconnection 17a.

It is only necessary to have at least one connecting point between VCP global power-supply interconnection 17a and dummy bit line 7a, so that the width of a sense-amplifier band SA or the sub word driver band SWD will not be increased.

The distance between each main word line 15 is relatively large in a 8-way system, in that one main word line 15 is connected to eight sub word lines. Intermediate interconnection 15a can thus be arranged within an area between each main word line 15. However, in case of 4-way hierarchical word line configuration, the distance between each main word line 15 comes to be smaller. In this case, main word line 15 is formed to have a shape that is not straight but is detouring intermediate interconnection 15a. Thus, an area between main word lines 15 is secured by slightly shifting each main word line 15. In any case, such arrangement of intermediate interconnection 15a and dummy bit line 7a will not increase the width of the sub word driver band SWD.

In the present embodiment, the voltage (cell plate voltage: VCP) applied to cell plate 13 and the pre-charge voltage (VBL) of bit line are both set to the voltage half of the array voltage VDD (VDD/2). Therefore, even if dummy bit line, i.e. a VCP local power-supply interconnection, and the adjacent bit line 7 should be short-circuited due to dust attached during an wafer process, for example, the current will not penetrate from bit line 7 to local power-supply interconnection 7a of VCP during a stand-by period. Thus, the defective bit line described above can be substituted without causing any increase of the stand-by current.

Dummy bit line 7a is arranged at the end-most portion of the bit lines running in parallel, where pattern repeatability is lost and pattern discontinuity tends to occur at the time of pattern formation. When the pattern discontinuity occurs, VCP may not satisfactory fed to cell plate 13. Therefore, it is preferred to have the region in the vicinity of dummy bit line 7a configured as shown in FIG. 5.

Figure 5:
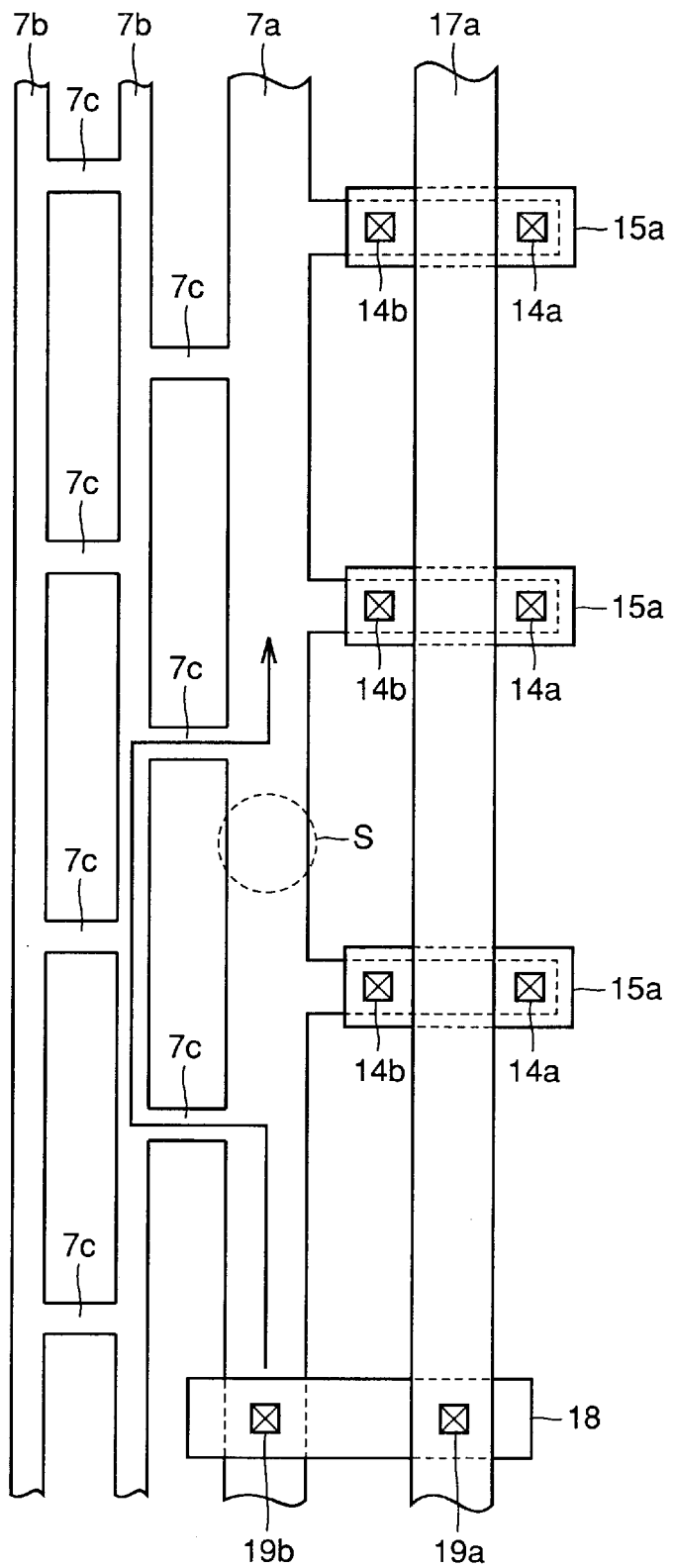
FIG. 5 is a plan view illustrating an arrangement in that a dummy bit line is connected with an additional dummy bit line at several portions.
Figure 6:
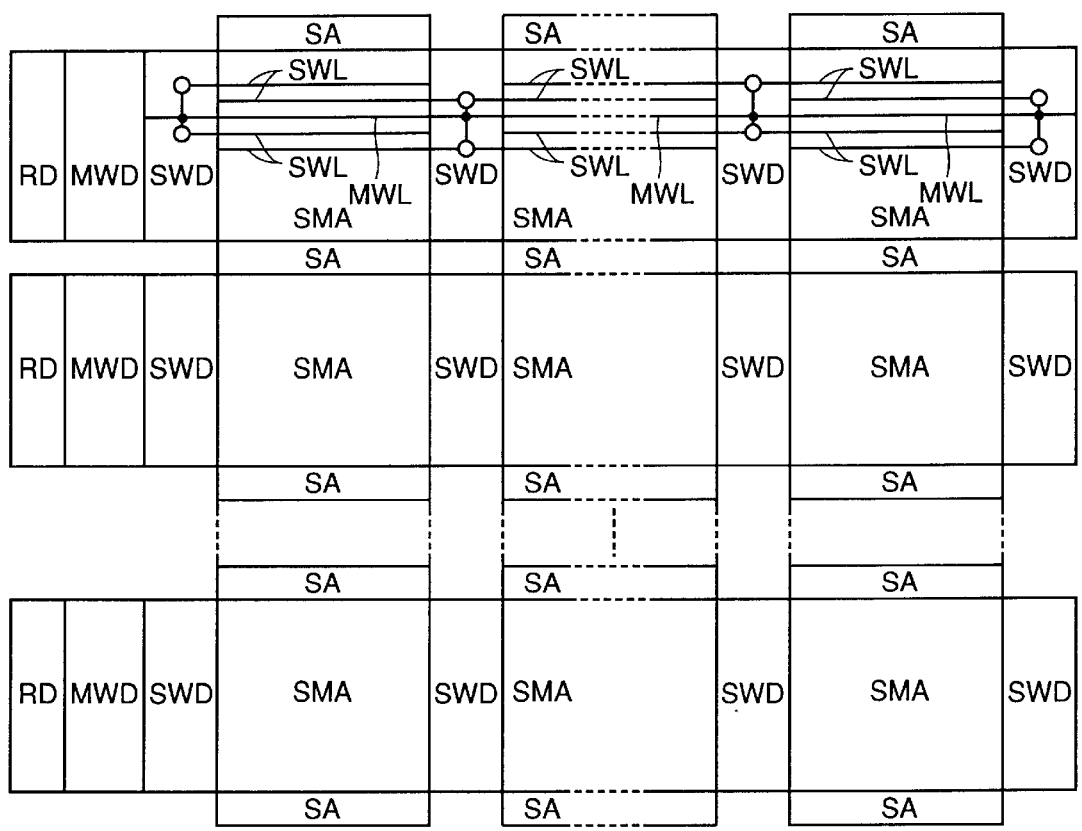
FIG. 6 is a schematic illustration of a general multi-divided memory array.
Figure 7:
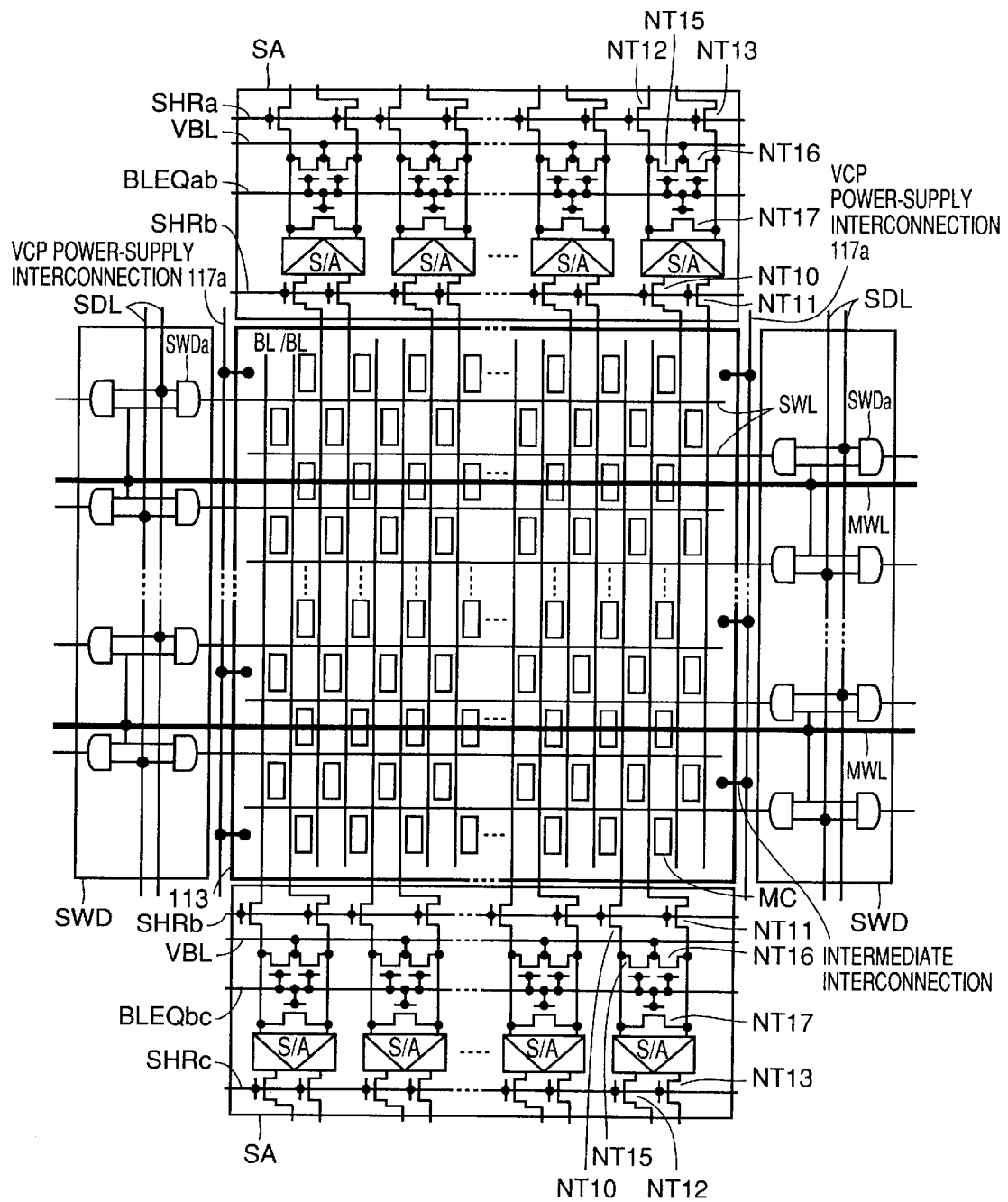
FIG. 7 is a detailed view of the configuration of a sub memory array, a sub word driver band and a sense amplifier band.
Figure 8:
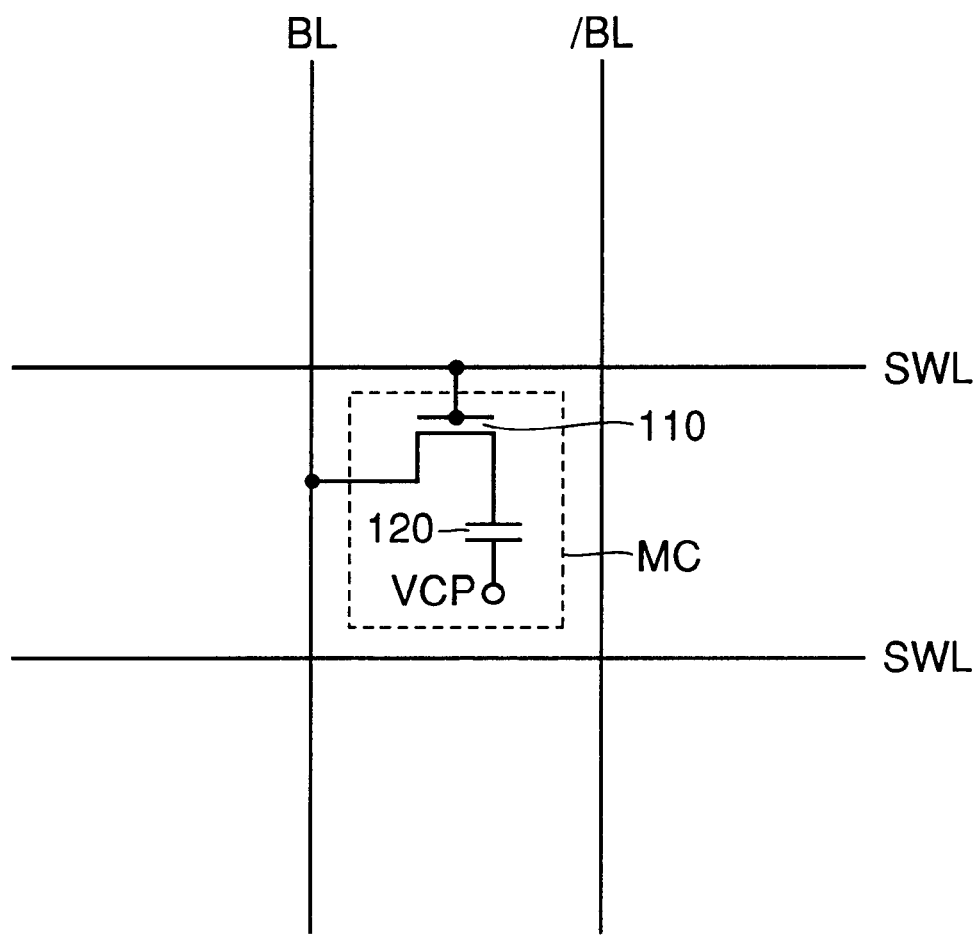
FIG. 8 illustrates a configuration of the memory cell of FIG. 7.

Referring to FIG. 5, an additional bit line 7b running in parallel with dummy bit line 7a is connected to dummy bit line 7a at several portions by connecting portions 7c. Even if the pattern of dummy bit line 7a is disrupted at the region S of the FIG. 5, VCP can still be fed to all the cell plate connecting portions by detouring additional dummy bit line 7b using the path denoted by the arrow. Thus, VCP can be fed even more reliably to cell plate 13, making effective use of additional dummy bit line 7b.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a semiconductor substrate having a main surface,
    a bit line formed on said main surface,
    a dummy bit line formed from the same layer as and separately from said bit line, and running in parallel with said bit line,
    a capacitor having an upper electrode formed above said bit line, and
    a first intermediate interconnection formed above said capacitor and electrically connected to said dummy bit line and said upper electrode.

2. The semiconductor memory device according to claim 1, further comprising:
    a pair of source/drain regions formed at said main surface,
    a sub word line extending on the region sandwiched between said pair of source/drain regions with a gate insulating layer interposed, and
    a main word line formed from the same layer as and separately from said first intermediate interconnection, and formed as a hierarchical word line configuration together with said sub word line.

3. The semiconductor memory device according to claim 2, wherein
    a plurality of memory cells each including said capacitor and a transistor having said pair of source/drain regions and a gate electrode formed of said sub word line are arranged to configure a sub memory array,
    a plurality of said sub memory arrays being arranged to configure a memory cell array.

4. The semiconductor memory device according to claim 1, further comprising:
    an upper-layer interconnection formed above said first intermediate interconnection and electrically connected to said dummy bit line.

5. The semiconductor memory device according to claim 4, further comprising:
    a second intermediate interconnection formed from the same layer as and separately from said first intermediate interconnection; wherein
    said upper-layer interconnection is electrically connected to said dummy bit line with said second intermediate interconnection interposed.

6. The semiconductor memory device according to claim 1, wherein a voltage having a same level as a pre-charge voltage for said bit line is applied to said upper electrode via said dummy bit line and said first intermediate interconnection.

7. The semiconductor memory device according to claim 1, wherein a material of said first intermediate interconnection is metal, and a material of said bit line includes at least one of silicon and refractory metal.

8. The semiconductor memory device according to claim 1, further comprising:
    an additional dummy bit line running in parallel with said dummy bit line,
    said dummy bit line and said additional dummy bit line being connected at several portions.

9. The semiconductor memory device according to claim 2, wherein said first intermediate interconnection is disposed extending in parallel to said main word line.

10. The semiconductor memory device according to claim 1, wherein said dummy bit line has a branch for connecting with said first intermediate interconnection.

11. The semiconductor memory device according to claim 10, wherein said bit line is located at one side of said dummy bit line, and said branch extends to another side of said dummy bit line.

* * * * *